(12) United States Patent
Nishitani et al.

(10) Patent No.: US 7,663,407 B2
(45) Date of Patent: Feb. 16, 2010

(54) SEMICONDUCTOR DEVICE HAVING TRANSFER GATE BETWEEN PRE-BUFFER AND MAIN BUFFER

(75) Inventors: Tomoya Nishitani, Kanagawa (JP); Kenichi Kawakami, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 32 days.

(21) Appl. No.: 12/213,780

(22) Filed: Jun. 24, 2008

(65) Prior Publication Data

US 2009/0015292 A1  Jan. 15, 2009

(30) Foreign Application Priority Data

Jul. 9, 2007  (JP) ............... 2007-179364

(51) Int. Cl.
*H03K 19/094* (2006.01)
(52) U.S. Cl. .......................... 326/83; 326/27
(58) Field of Classification Search ................ 326/21, 326/26, 27, 82–87
See application file for complete search history.

(56) References Cited

U.S. PATENT DOCUMENTS 6,313,957 B1 * 11/2001 Heemstra et al. ............ 359/738

2009/0230993 A1 * 9/2009 Momtaz ...................... 326/83

FOREIGN PATENT DOCUMENTS

JP  10-308098  11/1998

OTHER PUBLICATIONS

"USB Complete SIB Access" by Acserson and Jan (translated by Insight International), Sold by Seiunsha Publishing Co., Ltd., P380, chapter 210 Electrical Interface Circuit (USB Transceiver).

* cited by examiner

*Primary Examiner*—Don P Le
(74) *Attorney, Agent, or Firm*—McGinn IP Law Group, PLLC

(57) ABSTRACT

A semiconductor device includes a pre-buffer for transferring a data signal on the basis of a first power supply voltage, a main buffer for amplifying and outputting the data signal transferred by the pre-buffer on the basis of a second power supply voltage different from the first power supply voltage, a switch unit for controlling a conductive state between the pre-buffer and the main buffer on the basis of a switch control signal, and a control circuit for generating the switch control signal for controlling the pre-buffer to set an output level of the pre-buffer to ground potential in accordance with transition of logical level of the switch control signal.

17 Claims, 12 Drawing Sheets

US 7,663,407 B2

SEMICONDUCTOR DEVICE HAVING TRANSFER GATE BETWEEN PRE-BUFFER AND MAIN BUFFER

BACKGROUND OF THE INVENTION

1. Field of the Invention

The present invention relates to a semiconductor device, and particularly to a semiconductor device provided with an input buffer or an output buffer.

2. Description of Related Art

In these years, since a variety of semiconductor devices have been manufactured, it has often been required to realize a level shift of amplitude of a signal to the semiconductor device at the time of connecting these semiconductor devices in accordance with an input level and output level. Therefore, attention is paid to the technology to give a level shift function to an input buffer and an output buffer of semiconductor device. An example of this technology will be explained below using USB2.0.

As the interface specification for connection between a personal computer and peripheral devices thereof, USB2.0 (Universal Serial Bus) is used. For this SB2.0, three kinds of transfer mode of HS (High Speed), FS (Full Speed), and LS (Low Speed) are prepared. Particularly, in the HS mode, remarkable high speed (480 Mbps) data transfer can be realized in comparison with USB1.1 of the related art.

FIG. 8 shows a USB input/output circuit 80 combining an HS circuit for transferring data signal in the HS mode and an FS/LS circuit for transferring data signal in the FS or LS mode. The USB input/output circuit 80 includes an HS output circuit 81, an HS input circuit 82, an FS/LS output circuit 83, and an FS/LS input circuit 84. Outputs of the HS output circuit 81 and FS/LS output circuit 83 and inputs of the HS input circuit 82, FS/LS input circuit 84 are connected with wires at an input/output terminal D+ and input/output terminal D−. Moreover, a data input terminal DATA, an enable terminal ENABLE, a clock input terminal CLOCK, and a mode switching terminal MODE are connected respectively to the HS output circuit 81, HS input circuit 82, FS/LS output circuit 83, and FS/LS input circuit 84. Owing to the structure explained above, the USB input/output circuit 80 can input/output the data to and from the input/output terminal D+ and input/output terminal D−.

FIG. 9 shows an HS output circuit 81 provided within the USB input/output circuit 80 shown in FIG. 8. A logic circuit 91 inputs a data signal DS to be inputted to the data input terminal DATA and outputs a data signal DS on the basis of the mode switching signal MS and the clock signal CS. A pre-buffer 92 drives the data signal DS outputted from the logic circuit 91 on the basis of a first power supply voltage VDD1. A shutdown circuit 93 controls conductive state between the pre-buffer 92 and the main buffer 94 on the basis of the mode switching signal MS inputted to the mode switching terminal MODE. The main buffer 94 inputs the data signal DS outputted by the pre-buffer 92 via the shutdown circuit 93 and outputs the amplified data signal DS to the input/output terminals D+, D− on the basis of a second power supply voltage VDD2 higher than the first power supply voltage VDD1.

This HS output circuit 81 of the related art conducts operations of the FS/LS mode or HS mode as will be explained below. In the case of FS/LS mode (refer to T0 to T1 in FIG. 10), the shutdown circuit 93 enters the off-state on the basis of an input of the mode switching signal MS, for example, of "H" level. Therefore, the shutdown circuit 93 cuts off a signal path between the pre-buffer 92 and the main buffer 94. Therefore, a voltage outputted by the FS/LS circuit is impressed (refer to FIG. 8) to the input/output terminals D+, D− connected to the main buffer 94. Meanwhile, in the case of the HS mode, (refer to T1' to T2 in FIG. 10), the shutdown circuit 93 enters on-state on the basis of input of the mode switching signal MS, for example, of "L" level. Accordingly, the data signal DS outputted by the pre-buffer 92 is inputted to the main buffer 94 via the shutdown circuit 93.

As explained above, in the HS output circuit 81 of the related art, the shield circuit 93 enters on-state or off-state on the basis of the mode switching signal MS. In the HS mode, the data signal DS inputted to the data input terminal DATA is outputted to the input/output terminals D+, D− connected to the main buffer 94.

As the related arts, the patent document I discloses a semi-conductor device (refer to FIG. 12) wherein a switch N124 is provided between a logic circuit 121 in a preceding stage to be operated with a first power supply voltage and a logic circuit 122 in a subsequent stage to be operated with a second power supply voltage higher than the first power supply voltage.

[Non-patent document 1] "USB Complete SIB Access" by Acserson and Jan (translated by Insight International), Sold by Seiunsha Publishing Co., Ltd.; P380, Chapter 210 Electrical Interface Circuit (USB Transceiver)

[Patent document 1] Japanese Laid Open Patent Application Hei 10(1998)-308098

However, in the HS output circuit 81 shown in FIG. 9, a spike-wise noise has been generated in a signal outputted from the pre-buffer 92 when the mode is switched to the HS mode from the FS/LS mode.

FIG. 11 shows partially enlarged pre-buffer 92, shutdown circuit 93, and main buffer 94 within the HS output circuit of a related art. In a PMS transistor P94 provided in the main buffer 94, a parasitic capacitance C is formed. Here, when the mode is switched to the HS mode from the FS/LS mode, a transfer gate constituted with the PMOS transistor P95 and the NMOS transistor N93 is turned to the on-state from the off-state. Therefore, a voltage applied to a gate of the PMOS transistor P94 is shifted from the second power supply voltage VDD2 to the first power supply voltage VDD1 lower than the second power supply voltage VDD2. Therefore, charges accumulated in the parasitic capacitance C flow into an inverter INV92 via the transfer gate. In this timing, a signal of "L" level outputted by the logic circuit 91 is inputted to the inverter INV92. Therefore, the PMOS transistor P92 of the inverter INV92 is in the on-state. Accordingly, charges accumulated in the parasitic capacitance C flow into the first power supply voltage VDD1 via the PMOS transistor P92. Namely, in the period of T1 to T1' shown in FIG. 10, voltage of the signal outputted from the inverter INV92 is raised with such inverse current. A spike noise generated in this timing exceeds voltage resistance of the NMOS transistor N92, resulting thereby deterioration of characteristic or electrical breakdown of the NMOS transistor N92. Particularly, in the case where INV92 including the NMOS transistor N92 is designed under the voltage resistance corresponding to the power supply VDD1 (should be lower than VDD2), probability of occurrence of characteristic deterioration and electrical breakdown becomes distinctive.

Moreover, even in the semiconductor device described in the patent document 1, an inverse current is generated toward the first power supply voltage from the second power supply voltage and thereby a spike noise is generated, resulting in the problems explained above, in the case where the signal of "H" level is transferred to the logic circuit 122 in the subsequent state from the logic circuit 121 of the preceding stage.

SUMMARY OF THE INVENTION

According to an exemplary aspect of the present invention, the semiconductor device includes a pre-buffer for transferring data signal on the basis of a first power supply voltage, a main buffer for amplifying and outputting data signal transferred by the pre-buffer on the basis of the second power supply voltage different from the first power supply voltage, a switch unit for controlling conductive state of the pre-buffer and main buffer on the basis of a switch control signal, and a control circuit for generating the switch control signal and also generating the data signal to set an output level of the pre-buffer to the ground potential in accordance with transition of the logical level of the switch control signal.

According to the exemplary aspect, it is possible to provide a semiconductor device for preventing breakdown or deterioration of a transistor can be provided by inputting a data signal generated by the control circuit to a pre-buffer to equalize an output level of the pre-buffer to the ground potential.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 1:
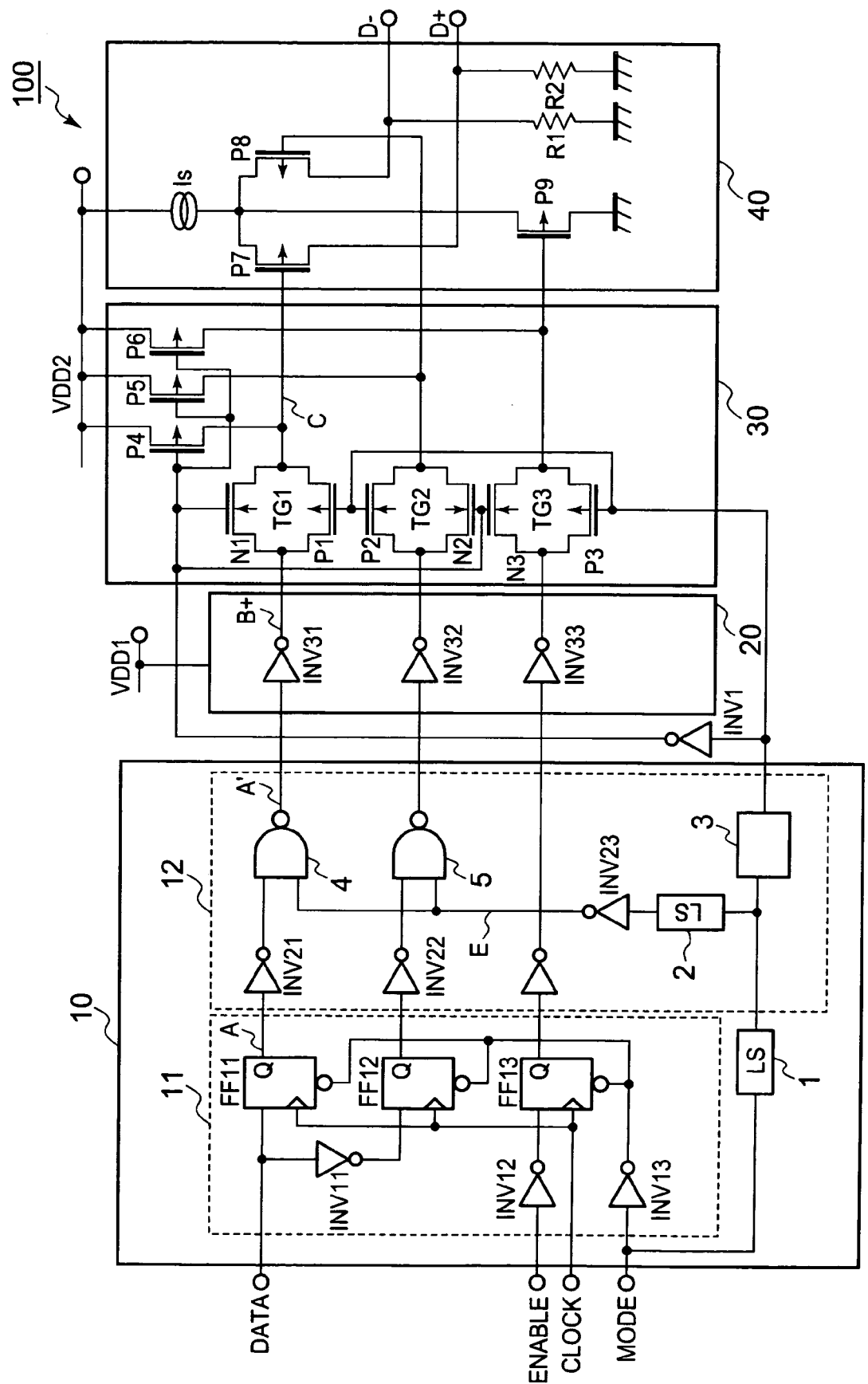
FIG. 1 shows an HS output circuit 100 as a first exemplary embodiment of the present invention.

FIG. 1 shows a semiconductor device 100 related to an exemplary embodiment of the present invention (hereinafter, referred to as an HS output circuit). As shown in FIG. 1, the HS output circuit 100 includes a control circuit 10, a pre-buffer 20, a switch unit (hereinafter, referred to as a shutdown circuit) 30, a main buffer 40, a level shifter 1, and an inverter INV1.

The control circuit 10 generates a switch control signal for controlling opening or closing state and opening or closing timing of the shutdown circuit 30. Moreover, the control circuit 10 controls generation of signal to be inputted to the pre-buffer in accordance with the opening or closing state of the shutdown circuit 30. The pre-buffer 20 transfers the data signal DS to be inputted to the data input terminal on the basis of the first power supply voltage. The shutdown circuit 30 controls conductive state between the pre-buffer 20 and the main buffer 40 on the basis of the mode switching signal MS. The main buffer 40 amplifies the data signal DS transferred by the pre-buffer 20 and outputs the amplified data signal DS to the input/output terminals D+ and D−. Hereinafter, individual blocks of the HS output circuit 100 will be explained below in detail with reference to FIG. 1.

The control circuit 10 is constituted with a logic circuit 11 and a switch control circuit 12. The logic circuit 11 includes flip-flop circuits FF11 to FF13, and inverters INV11 to INV13. An input of the flip-flop circuit FF11 is connected with the data input terminal DATA and an input of the flip-flop circuit 12 is connected with the data input terminal DATA via the inverter INV 11. Moreover, an input of the flip-flop circuit FF13 is connected with an enable terminal ENABLE via the inverter INV 12. Connection of an output Q of the flip-flop circuits FF11 to FF13 will be explained together with a structure of the switch control circuit 12 explained later. Moreover, a clock part of the flip-flop circuits FF11 to FF13 is connected with a clock terminal CLOCK, while a reset part thereof is connected with a mode switching terminal MODE via the inverter INV13.

The switch control circuit 12 includes inverted AND circuits (hereinafter, referred to as NAND circuit) 4, 5, inverters INV 21 to INV 23, a level shifter 2, and a delay adjusting circuit 3. An input of the level shifter 2 is connected to the mode switching terminal MODE via the level shifter 1, while an output thereof is connected to the input of the NAND circuit 4 and NAND circuit 5 via the inverter INV23. Moreover, an input of the NAND circuit 4 is connected with an output Q of the flip-flop circuit FF11 via the inverter INV21 and an input of the NAND circuit 5 is connected with an output Q of the flip-flop circuit FF12 via the inverter INV22. In addition, connection of the output Q of the NAND circuit 4 and NAND circuit 5 will be explained together with a structure of the pre-buffer 30 to be explained later. Moreover, an input of the delay adjusting circuit 3 is connected to the mode switching terminal MODE via the level shifter 1, while an output thereof is connected to the shutdown circuit 30.

The pre-buffer 20 includes inverters INV31 to INV33. Input of the inverters INV31, INV32 is respectively connected to the output of the NAND circuit 4 and the output of the NAND circuit 5 and input of the inverter INV33 is connected to the output Q of the flip-flop circuit FF13. Moreover, connection of the output of the inverters INV31 to INV33 will be explained together with a structure of the shutdown circuit 30 to be explained later. The inverters INV31 to INV33 constituting the pre-buffer 20 are connected to the first power supply voltage VDD1.

The shutdown circuit 30 includes PMOS transistors P1 to P6 and NMOS transistors N1 to N3. The NMOS transistor N1 and the PMOS transistor P1 form a transfer gate TG1. A drain of the NMOS transistor N1 and a drain of the PMOS transistor P1 are connected in common and source of the NMOS transistor N1 and source of the PMOS transistor P1 are connected in common. Moreover, an input of the transfer gate TG1 is connected with an output of the inverter INV31. The NMOS transistor N1 and the PMOS transistor P2 form a transfer gate TG2. A drain of the NMOS transistor N2 and a drain of the PMOS transistor P2 are connected in common and a source of the NMOS transistor N2 and a source of the PMOS transistor P2 are connected in common. In addition, an input of the transfer gate TG2 is connected with an output of the inverter INV32. The NMOS transistor N3 and PMOS transistor P3 constitute a transfer gate TG3. Drains of the NMOS transistor N3 and the PMOS transistor P3 are connected in common and sources of the NMOS transistor N3 and the PMOS transistor P3 are also connected in common. Moreover, an input of the transfer gate TG3 is connected with an output of the inverter INV33. In addition, an output of the transfer gates TG1 to TG3 will be explained together with a structure of the main buffer 40 that will be explained later.

Gates of the NMOS transistor N1 to N3 are connected with an output of the delay adjusting circuit 3 via the inverter INV 1, while the gates of the PMOS transistors P1 to P3 are connected with an output of the delay adjusting circuit 3.

Sources of the PMOS transistors P4 to P6 are connected to the second power supply voltage VDD2 (>first power supply voltage VDD1) and sources thereof are connected to the output of the delay adjusting circuit 3 via the inverter INV1. The drain of the PMOS transistor P4 is connected to a node between the output of the transfer gate TG1 and the gate of the PMOS transistor P7 within the main buffer 40. Moreover, the drain of the PMOS transistor P5 is connected to a node between the output of the transfer gate TG2 and the gate of the PMOS transistor P8 within the main buffer 40. In addition, the drain of the PMOS transistor P6 is connected to a node between the output of the transfer gate TG3 and the PMOS transistor P9 within the main buffer 40.

The main buffer 40 includes PMOS transistors P7 to P9, resistors R1, R2, and a current source Is. The PMOS transistors P7 and P8 constitute a differential circuit. A drain of the PMOS transistor P7 is connected to the input/output terminal D+, while a drain of the PMOS transistor P8 is connected to the input/output terminal D−. Moreover, the sources of the PMOS transistors P7 and P8 are connected to the second power supply voltage VDD2 (>first power supply voltage VDD1) via the current source Is. The gate of the PMOS transistor P7 is connected to the output of the transfer gate TG1 and the gate of the PMOS transistor P8 is connected to the output of the transfer gate TG2. The source of the PMOS transistor p9 is connected to the second power supply voltage VDD2 via the current source Is, while the drain is connected to the ground potential. The gate of the PMOS transistor P9 is connected to the output of the transfer gate TG3. One end of the resistance R1 is connected to a node between the drain of the PMOS transistor P8 and the input/output terminal D−, while the other end thereof is connected to ground potential. In addition, one end of the resistance R2 is connected to a node between the drain of the PMOS transistor P7 and the input/output terminal D+, while the other end is connected to the ground potential.

Figure 2:
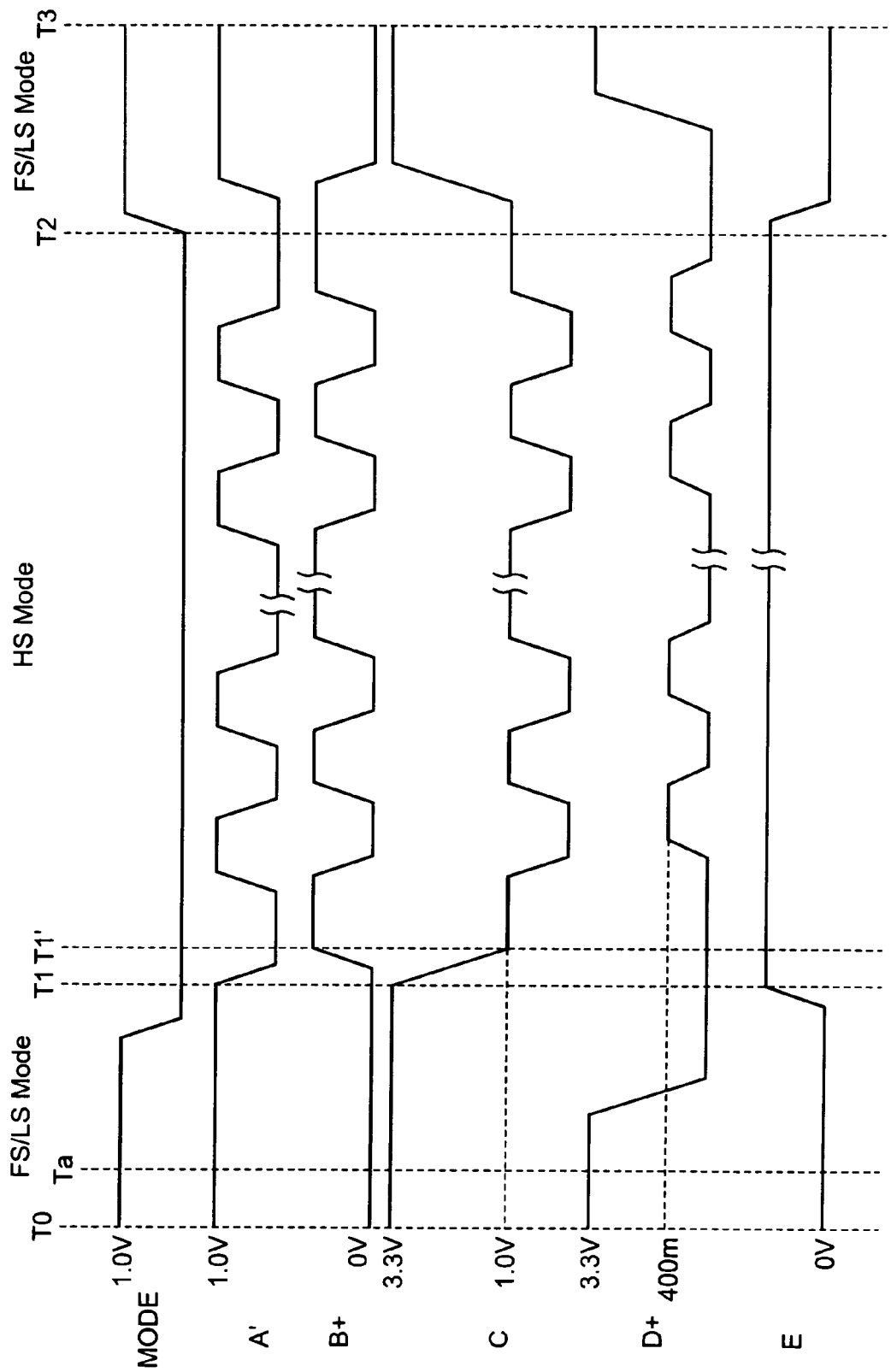
FIG. 2 is a timing chart showing a waveform at each point in the HS output circuit 100 of the first embodiment.

FIG. 2 is a timing chart showing a waveform of each part in the HS output circuit 100 shown in FIG. 1. Operations of the HS output circuit 100 of this exemplary embodiment will be explained below in detail with reference to FIG. 1 and FIG. 2.

First, operations in the FS/LS mode (refer to T0 to T1, T2 to T3 in FIG. 2) will be explained. A mode switching signal MS inputted to the mode switching terminal MODE has the "H" level. The mode switching signal MS in the "H" level is respectively inputted to the reset terminals of the flip-flop circuits FF11 to FF13 via the inverter INV13. Therefore, the flip-flop circuits FF11 to FF13 are reset. Accordingly, the data signal DS outputted from the flip-flop circuits FF11 to FF13 has the "L" level.

The data signal DS outputted from the flip-flop circuit FF11 is inverted via the inverter INV21 and is then inputted to the NAND circuit 4. On the other hand, the mode switching signal MS inputted to the mode switching terminal MODE is inverted via the inverter INV23 (refer to node E in Ta of FIG. 2) and is then inputted to the NAND circuit 4. Therefore, the data signal DS outputted from the NAND circuit 4 has the "H" level (Refer to node A in Ta of FIG. 2). The data signal DS outputted by the NAND circuit 4 is inputted to the inverter INV31. Therefore, the data signal DS outputted from the inverter INV31 has the "L" level (refer to node B+in Ta of FIG. 2).

Meanwhile, the data signal DS outputted by the flip-flop circuit FF12 is inverted via the inverter INV22 and is then inputted to the NAND circuit 5. On the other hand, the mode switching circuit MS inputted to the mode switching terminal MODE is inverted via the inverter INV23 and is then inputted to the NAND circuit 5. Therefore, the data signal DS outputted from the NAND circuit 5 has the "H" level. The data signal DS outputted by the NAND circuit 5 is inputted to the inverter INV32. Accordingly, the data signal DS output from INV32 has the "L" level.

In addition, the mode switching signal MS inputted to the mode switching terminal MODE is inputted to the delay adjusting circuit 3. The delay adjusting circuit 3 generates a switch control signal on the basis of input of this mode switching signal MS. This switch control signal is inputted to the gates of the PMOS transistors P1 to P3 forming the transfer gates TG1 to TG3. Moreover, the switch control signal is inverted via the inverter INV1 and is then inputted to the gates of the NMOS transistors N1 to N3 forming the transfer gate. Therefore, the transfer gates TG1 to TG3 enter the off-state. Namely, the data signal DS outputted by the inverters INV31 and INV32 within the pre-buffer 20 and the enable signal ES outputted by the inverter INV33 are cut off.

Figure 8:
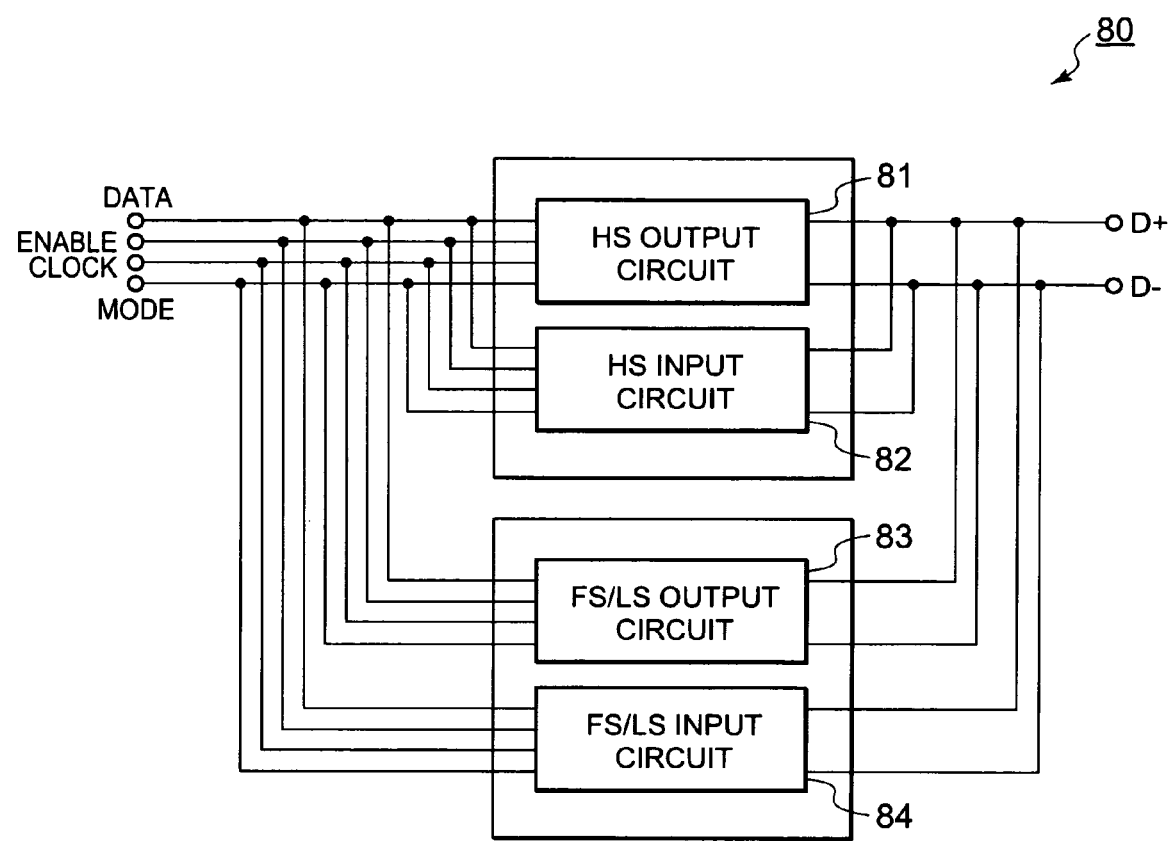
FIG. 8 shows a USB input/output circuit 80 including an HS output circuit 81 explained in the non-patent document 1.
Figure 9:
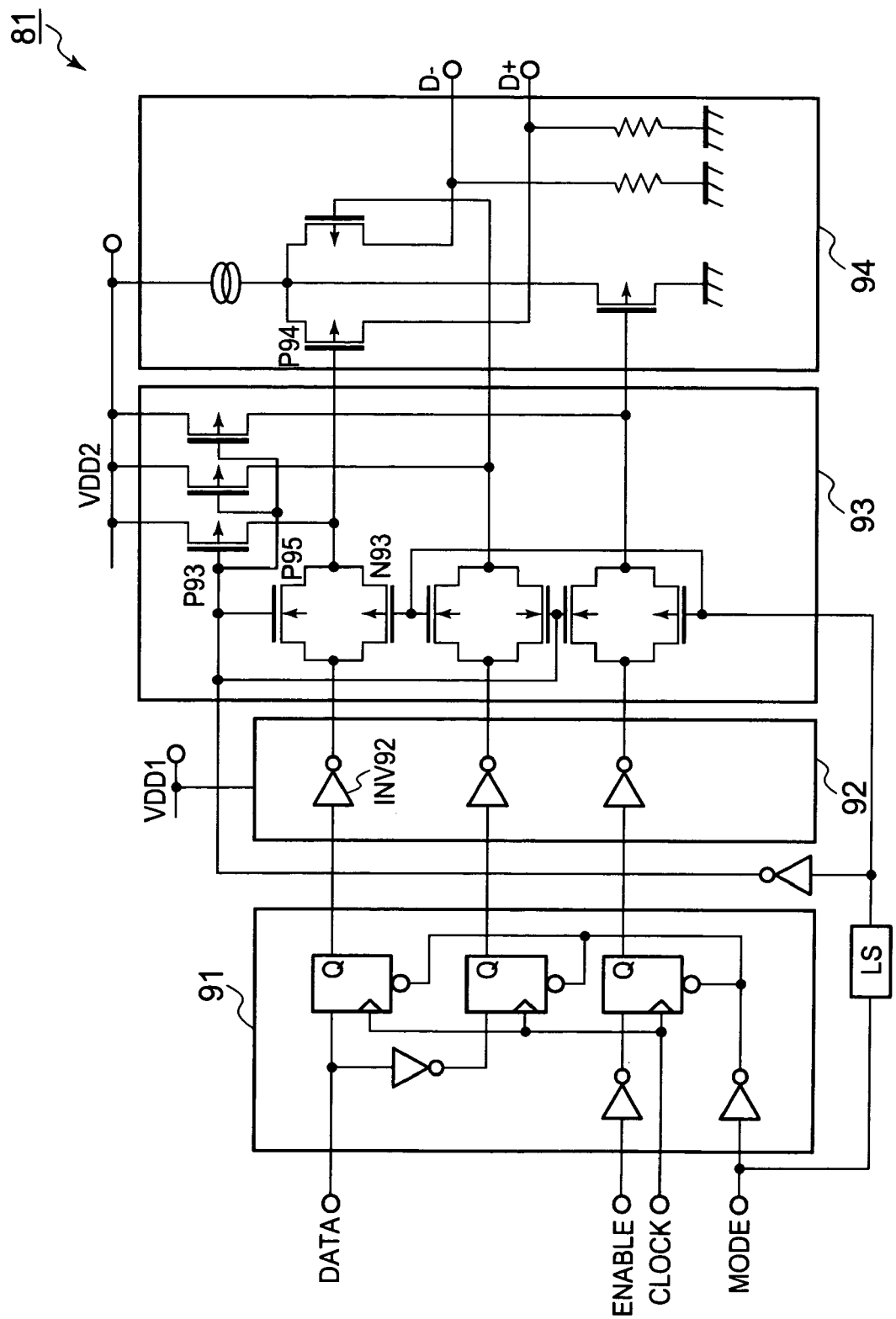
FIG. 9 shows the HS output circuit 81 explained in the non-patent document 1.
Figure 10:
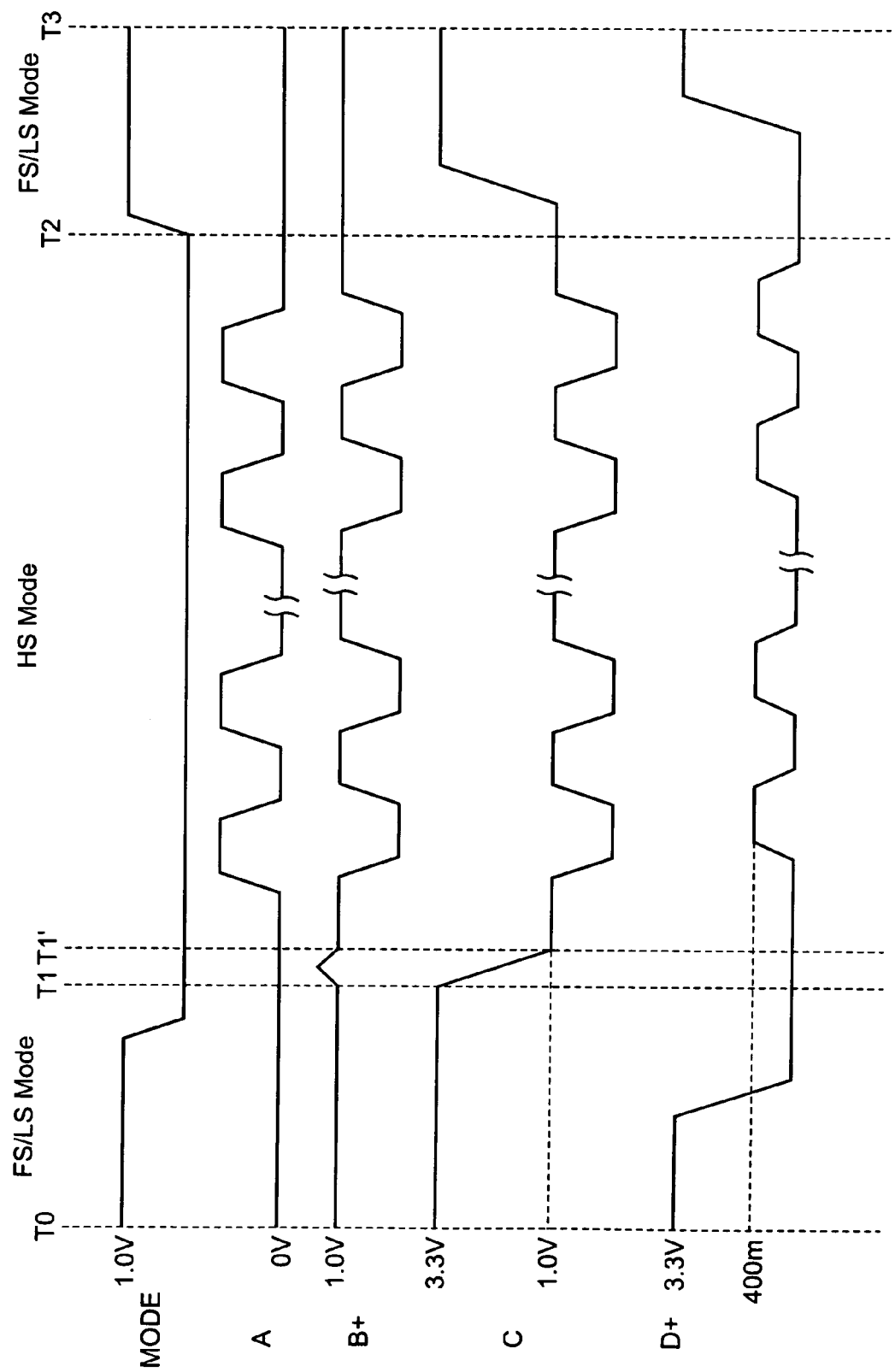
FIG. 10 is a timing chart showing a waveform at each point in the HS output circuit 81 explained in the non-patent document 1.
Figure 11:
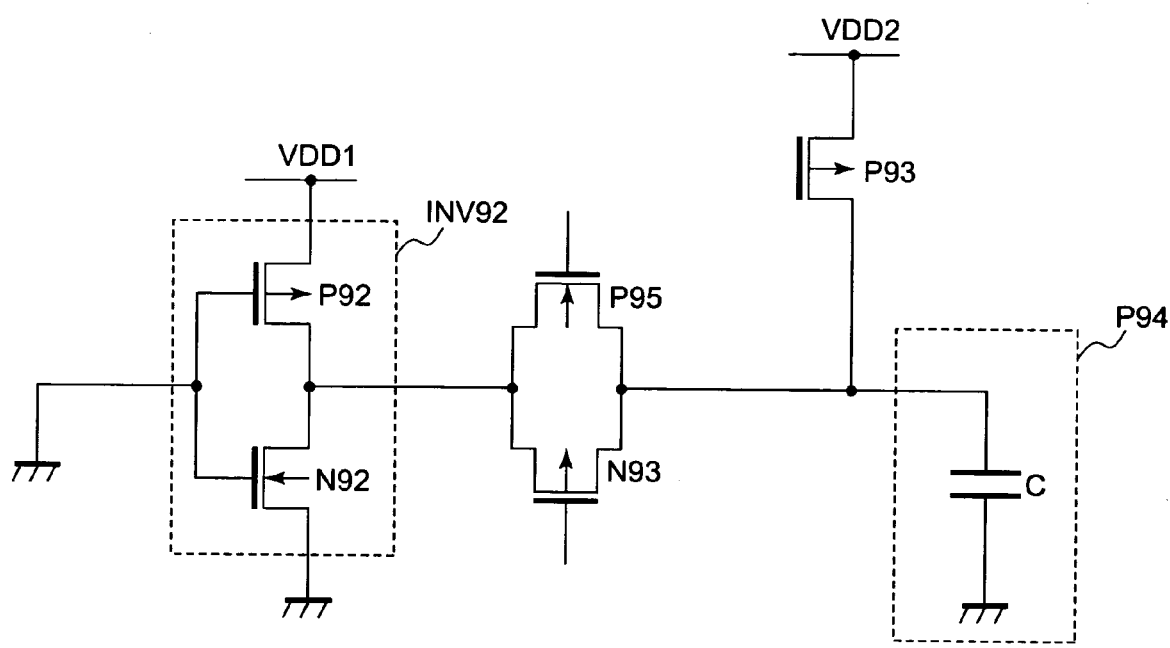
FIG. 11 shows a partially extracted circuit of a pre-buffer, a shutdown circuit, and a main buffer within the HS output circuit 81 explained in the non-patent document 1.
Figure 12:
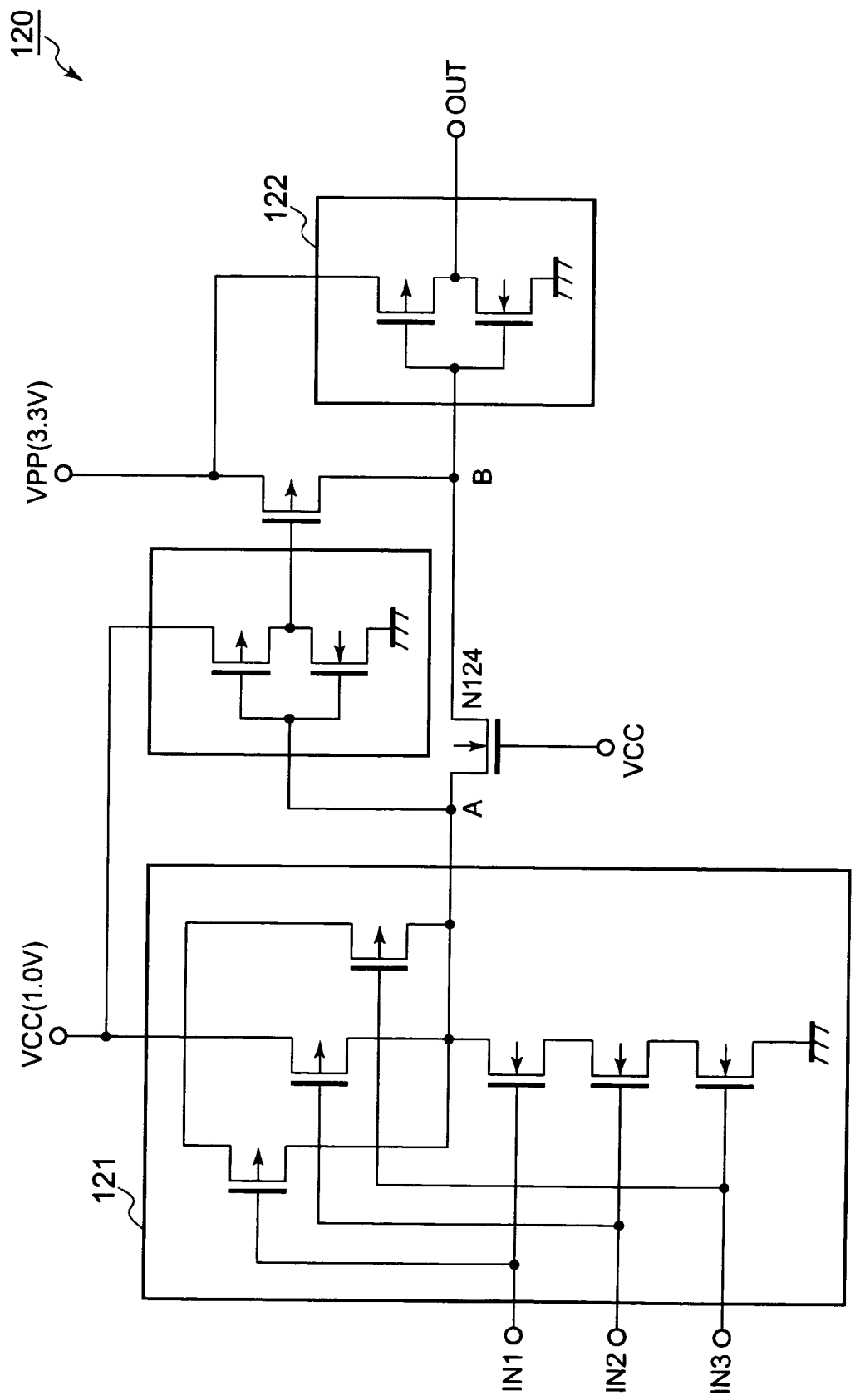
FIG. 12 shows a semiconductor device 120 explained in the patent document 1.

The switch control signal outputted from the inverter INV1 has the "L" level. This switch control signal is then inputted to the gates of the PMOS transistors P4 to P6. Therefore, the PMOS transistors P4 to P6 enter the on-state. Accordingly, the power supply voltage VDD2 is connected to the gates of the PMOS transistors P7, P8, and P9 within the main buffer 40 connected respectively to the PMOS transistors P4, P5, and P6. Namely, an input of the main buffer 40 is fixed to the second power supply voltage (for example, 3.3V) in the FS/LS mode (refer to node C in Ta of FIG. 2). Moreover, since the signal (power supply voltage VDD2) of the "H" level is inputted to the gates of the PMOS transistors P7 to P9, the PMOS transistors P7 to P9 enter the off-state. Therefore, an output of the main buffer 40 is suspended. In this case, the signal, for example, of 3.3V outputted by the FS/LS output circuit (refer to FIG. 8) is impressed to the input/output terminal D+ (refer to node D in Ta of FIG. 2).

As explained above, in the FS/LS mode, the shutdown circuit 30 cuts off connection between the pre-buffer 20 and the main buffer 40 on the basis of the switch control signal generated in accordance with the mode switching signal MS. In this case, the data signal DS outputted from the inverters INV31, INV32 has the "L" level on the basis of the data signal DS inputted from the switch control circuit 12. Moreover, an input of the main buffer 40 is fixed to the second power supply voltage.

Subsequently, operations when the FS/LS mode is switched to the HS mode will be explained (refer to T1 to T1' in FIG. 2). In this case, the mode switching signal MS inputted to the mode switching terminal MODE has the "L" level. This mode switching signal MS is inputted to the delay adjusting circuit 3. The delay adjusting circuit 3 controls the shutdown circuit 30 to adjust the transition timing of the "L" level signal outputted by the pre-buffer 20 almost equal to the transition timing of the first power supply voltage from the second power supply voltage inputted to the main buffer 40. Namely, the delay adjusting circuit 3 inputs the mode switching signal MS and outputs the switch control signal delayed for the predetermined period. Therefore, the shutdown circuit 30 is switched to the on-state from the off-state with delay of the predetermined delay time after the mode switching signal MS is shifted to the "L" level from the "H" level. Therefore, in the timing where the shutdown circuit 30 is switched to the on-state from the off-state, the pre-buffer 20 can output the "L" level signal.

The switch control signal delayed by the delay adjusting circuit 3 has the "L" level. This switch control signal is inputted to the gates of the main buffer PMOS transistors P1 to P3. Moreover, this switch control signal is inverted by the inverter INV1 and is then inputted to the gates of the NMOS transistors N1 to N3. Therefore, the transfer gates TG1 to TG3 enter the on-state. The switch control signal outputted from the inverter INV1 has the "H" level. This switch control signal is inputted to the gates of the PMOS transistors P4 to P6. Accordingly, the PMOS transistors P1 to P3 enter the off-state.

Figure 3:
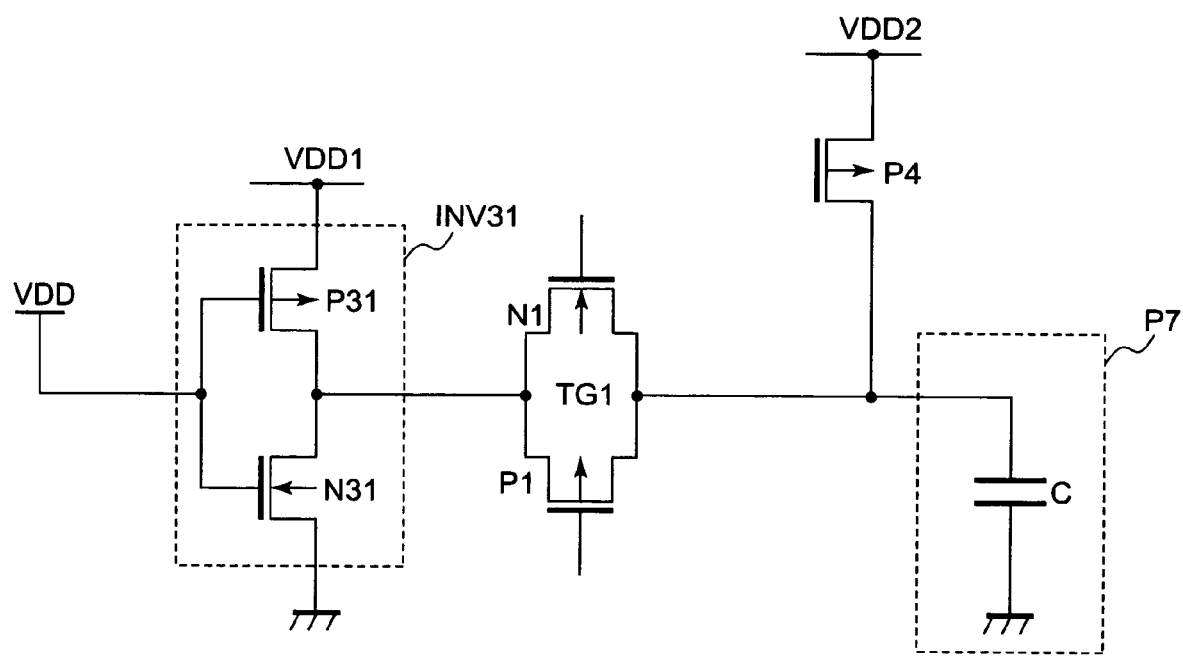
FIG. 3 shows a partially extracted circuit of a pre-buffer, a shutdown circuit, and a main buffer within the HS output circuit of the first embodiment.

FIG. 3 shows a circuit where a part of the pre-buffer 20, the shutdown circuit 30, and main buffer 40 within the HS output circuit 100 is eliminated. Operations when the FS/LS mode is switched to the HS mode will be explained with reference to FIG. 3. The inverter INV31 within the pre-buffer 20 is constituted with the PMOS transistor P31 and the NMOS transistor N31. A source of the PMOS transistor N31 is connected to the first power supply voltage VDD1 and a drain thereof is connected to the drain of the NMOS transistor N31. Moreover, a source of the NMOS transistor N31 is connected to the ground potential. One end of the transfer gate TG1 is connected to the node between the PMOS transistor P3 and the NMOS transistor N31. Moreover, the other end of the transfer gate TG1 is connected with one end of a parasitic capacitance C. The other end of the capacitance is connected with the ground potential. This parasitic capacitance C is the parasitic capacitance connected between the gate and the source of between the gate and the drain of the PMOS transistor P7 and is schematically shown as the capacitance C in FIG. 4. Moreover, the node between the transfer gate TG1 and the parasitic capacitance C is connected to the second power supply voltage VDD2 via the PMOS transistor P4.

When the transfer gate TG1 enters on-state, a gate voltage inputted to the PMOS transistor P7 shifts from the second power supply voltage VDD2 to the first power supply voltage VDD1 that is lower than the second power supply voltage VDD2. Therefore, charges stored in the parasitic capacitance C of the PMOS transistor P7 flow into the inverter INV31.

Meanwhile, in the timing where the FS/LS mode is switched to the HS mode (refer to T1 in FIG. 2), the signal having the "H" level is inputted to the gates of the PMOS transistor P31 and the NMOS transistor N31 within the inverter INV31. Therefore, the PMOS transistor P31 turns off, while the NMOS transistor N31 turns on. Accordingly, the signal outputted from the inverter INV31 has the "L" level. As a result, charges stored in the parasitic capacitance C flow toward the ground potential via the NMOS transistor N31.

As explained above, in the timing where the FS/LS mode is switched to the HS mode, the signal inputted to the inverter INV31 has the "H" level and the signal outputted from the inverter INV31 has the "L" level. Accordingly, when the transfer gate TG1 enters the conductive state, charges accumulated in the parasitic capacitance C of the PMOS transistor P7 flow toward the ground potential via the NMOS transistor N31.

Here, in FIG. 3, charges flow into the inerter INV31 from the PMOS transistor 7 via the transfer gate TG1. However, charges also flow to the inverter INV32 from the PMOS transistor P8 via the transfer gate TG2 or charges flow to the inverter INV33 from the PMOS transistor P9 via the transfer gate TG3 in the same manner as explained above. Therefore, the detail explanation of processes of such flow will be eliminated here.

As explained above, when the FS/LS mode is switched to the HS mode, the charges accumulated in the parasitic capacitance C of the PMOS transistor in the main buffer flow toward the ground potential in the HS output circuit 100.

Operations in the HS mode will be explained continuously (refer to T1' to T2 in FIG. 2). The mode switching signal MS inputted to the mode switching terminal MODE has the "L" level. The mode switching signal MS outputted from the inverter INV13 has the "H" level in accordance with input of this mode switching signal MS. Therefore, the mode switching signal MS is inputted to the reset parts of the flip-flop circuits FF11 to the flip-flop circuit FF13. Accordingly, reset of the flip-flop circuit FF11 to flip-flop circuit FF13 is cancelled. Accordingly, the flip-flop circuit FF11 outputs the data signal DS inputted to the data input terminal DATA as the plus signal based on the clock signal CK (hereinafter, referred to as data signal DS+). Meanwhile, the flip-flop circuit FF12 outputs the data signal DS inputted to the data input terminal DATA as the minus signal via the inerter INV11 based on the click signal CK (hereinafter, referred to as data signal DS−). In addition, the flip-flop circuit FF13 outputs the enable signal ES inputted to the enable terminal ENABLE on the basis of the clock signal CK.

The data signal SD+ outputted by the flip-flop circuit FF11 is then inputted to the NAND circuit 4 via the inverter INV21. Meanwhile, the mode switching signal MS inputted to the mode switching terminal MODE is inverted via the inverter INV23 and is then inputted to the NAND circuit 4. Therefore, the data signal DS outputted from the NAND circuit 4 changes to the "H" level signal or "L" level signal (refer to T1' to T2, A' in FIG. 2). The data signal DS outputted by the NAND circuit 4 is then inputted to the inverter INV31. The inverter INV31 outputs the signal attained by inverting the data signal DS outputted from the NAND circuit 4. (Refer to T1' to T2, B+ in FIG. 2.) The data signal DS+ outputted by the inverter INV31 is then inputted to the PMOS transistor P7 via the transfer gate TG1 of the on-state (refer to T1' to T2, C in FIG. 2).

On the other hand, the data signal DS− outputted by the flop-flop circuit FF12 is inputted to the NAND circuit 5 via the inverter INV22. Meanwhile, when the mode switching signal MS inputted to the mode switching terminals MODE has the "L" level, the inverter INV23 outputs the "H" level signal and this signal is then inputted to the NAND circuit 5. Therefore, the data signal DS− outputted from the NAND circuit 5 has the "H" or "L" level. The data signal outputted from the NAND circuit 5 is inputted to the inverter INV32. The inverter INV32 outputs the signal attained by inverting the data signal DS outputted from the NAND circuit 5. The data signal DS− outputted by the inverter INV32 is inputted to the PMOS transistor P8 via the transfer gate TG2 in the on-state.

In addition, the enable signal ES outputted by the flip-flop circuit FF13 is inputted to an inverter INV33. The inverter INV33 outputs the signal attained by inverting the enable signal ES outputted by the flip-flop circuit FF13. The enable signal ES outputted by the inverter INV33 is inputted to the PMOS transistor P9 via the transfer gate TG3 in the on-state.

The enable signal ES inputted to the gate of the PMOS transistor P9 has the "H" level, turning off the PMOS transistor P9. Under this state, when the signal of "H" level is inputted to the PMOS transistor P7, the PMOS transistor P7 turns off. Therefore, the "L" level signal is outputted to the input/output terminal D+ (refer to D+ in FIG. 2). Thereafter, when the "L" level signal is inputted to the PMOS transistor P7, the PMOS transistor P7 enters the on-state. Therefore, the "H" level signal is outputted to the input/output terminal D+. In this case, a voltage level of the signal outputted to the input/output terminal D+ is equal to the value of Is×R2.

Moreover, when the "L" level signal is inputted to the PMOS transistor P8 while the PMOS transistor P9 is in the off-state, the PMOS transistor P8 enters the on-state. Therefore, the "H" level signal is outputted to the input/output terminal D−. In this case, a voltage level of the signal outputted to the input/output terminal D− becomes equal to the value of Is×R1. Thereafter, when the "H" level signal is inputted to the PMOS transistor P8, this PMOS transistor P8 enters the off-state. Therefore, the "L" level signal is outputted to the input/output terminal D−. As explained above, the main buffer 40 can output respectively the data signal D+ and D− having the predetermined amplitude level to the input/output terminal D+ and the input/output terminal D− through alternative repetition of the on and off-states of the PMOS transistor P7 and the PMOS transistor P8 forming a differential circuit.

As explained above, the shutdown circuit 30 is in the conductive state in the HS mode. Therefore, the data signal DS inputted to the data input terminal DATA is outputted to the input/output terminals D+ and D− via the shutdown circuit 30.

As explained above, the HS output circuit 100 of this embodiment has a switch control circuit 12 for inputting the signal of "H" level to the pre-buffer 20 when the FS/LS mode is switched to the HS mode. This switch control circuit 12 controls output of the data signal DS in accordance with a logical level of the mode switching signal MS. Therefore, the switch control circuit 12 can provide an output of the "H" level signal to the pre-buffer 20. The NMOS transistor connected to the ground potential within the inverter INV in the pre-buffer 20 enters on-state in accordance with this "H" level signal. Accordingly, charges accumulated in the parasitic capacitance C of the PMOS transistor in the main buffer 40 can flow toward the ground potential.

Therefore, the HS output circuit 100 of this embodiment can suppress spike noise generated in an output of the pre-buffer 20. Namely, deterioration or breakdown of the NMOS transistor can be prevented by preventing, on the occasion of mode switching, application of an over-voltage to the NMOS transistor within the pre-buffer 20.

Moreover, even if spike noise is generated and thereby a drain voltage of the NMOS transistor N31 rises in the HS output circuit 100, a gate voltage of the NMOS transistor N31 is equal to VDD1. Therefore, a gate-to-drain voltage of the NMOS transistor N3 I becomes equal to a value attained by subtracting the gate voltage VDD1 from amount of rise of the drain voltage. Namely, a voltage applied to a gate oxide film in the NMOS transistor N31 is smaller than the amplitude of spike noise. Accordingly, if spike noise is generated in an output of the inverter INV31 in the HS output circuit 100, rise of the gate-to-drain voltage of the NMOS transistor can be controlled. Therefore, in this exemplary embodiment, deterioration or breakdown of the NMOS transistor N31 can be prevented.

Moreover, the HS output circuit 100 of this embodiment has a delay adjusting circuit 3 for controlling the shutdown circuit 30 to adjust the transition timing of the "L" level signal outputted by the pre-buffer 20 almost equal to the transition timing of the signal inputted to the main buffer 40 to the first power supply voltage from the second power supply voltage. Since the shutdown circuit 30 is switched to the on-state from the off-state after delay of the predetermined period from transition of the mode switching signal MS to the "L" level from the "H" level in this delay adjusting circuit 3, the pre-buffer 20 can output the "L" level signal in the timing where the shutdown circuit 30 is switched to the on-state from the off-state.

Figure 4:
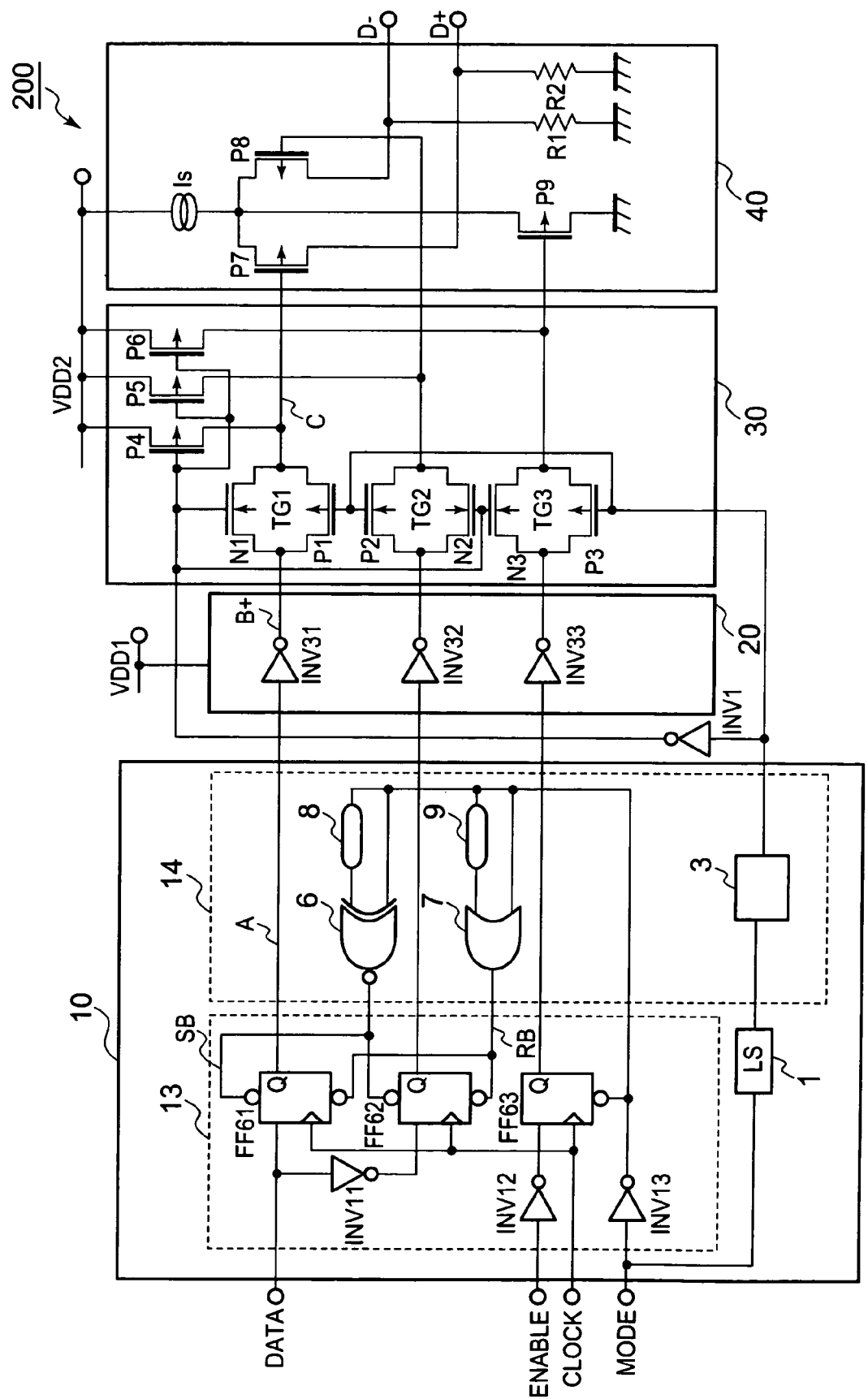
FIG. 4 shows an HS output circuit 200 as a second exemplary embodiment of the present invention.

FIG. 4 shows an HS output circuit 200 of the second exemplary embodiment. In FIG. 4, the elements in common to FIG. 1 are designated with the like reference numerals and detail explanation thereof is omitted here. The HS output circuit 100 in the first exemplary embodiment has the switch control circuit 12 between the logic circuit 11 and the pre-buffer 20. Meanwhile, in the HS output circuit 200 of this second embodiment, a set/reset circuit 14 is provided between the logic circuit 13 different in the internal structure from the logic circuit 1 of the first embodiment and the pre-buffer 20.

The logic circuit 13 is formed by changing the flip-flop circuits FF11 to FF13 in the logic circuit 11 to the flip-flop circuits FF61 to FF63. Structure other than connections of the set and reset terminals of the flip-flop circuits FF61 to FF63 is identical to that of the logic circuit 11, the duplicated explanation is eliminated here. Moreover, connections of the set and reset terminals of the flip-flop circuits FF61 to FF63 will be explained later together with the structure of the set/reset circuit 14.

The set/reset circuit 14 includes an EXNOR (EXCLUSIVE NOR) circuit 6, an OR circuit 7, a delay element 8, and a delay adjusting circuit 3. An input of the EXNOR circuit 6 is connected with the mode switching terminal MODE and the delay element 8 via the inverter INV13. An output of the EXNOR circuit 6 is connected to the set terminals of the flip-flop circuits FF61 and FF62. An input of the OR circuit is connected with the mode switching terminal MODE and the delay element 9 via the inverter INV 13. Moreover, an output of the OR circuit is connected with the reset terminals of the flip-flop circuits FF61, FF62.

Operations of the HS output circuit 200 of this second exemplary embodiment will be explained below with reference to the timing charts shown in FIG. 4 and FIG. 5. In the first exemplary embodiment, a current path to the ground potential connected to the pre-buffer 20 from the main buffer 40 is formed when the shutdown circuit 30 provided to control the conductive state between the pre-buffer 20 and the main buffer 40 is switched to the on-state from the off-state by inputting the arithmetic operation result computed by the switch control circuit 12 to the pre-buffer 20.

On the other hand, in this second exemplary embodiment, a current path to the ground potential connected to the pre-buffer 20 from the main buffer 40 is formed when the shutdown circuit 30 for controlling the conductive state between the pre-buffer 20 and the main buffer 40 is switched to the on-state from the off-state by controlling the arithmetic operation result outputted from the logic circuit 13 with the set/reset circuit 14. Operations of the HS output circuit 200 in this second embodiment are identical to that of the HS output circuit 100 in the first exemplary embodiment, except for operations of the logic circuit 13 and the set/reset circuit 14. Therefore, only operations of the logic circuit 13 and set/reset circuit 14 when the FS/LS mode is switched to the HS mode will be explained here.

In the FS/LS mode, the mode switching signal MS inputted to the mode switching terminal MODE has the "H" level. This mode switching signal MS is inverted via the inverter INV13 and inputted to the EXNOR circuit 6 and the OR circuit 7. That is, the signal of "L" level is inputted as the inputs of the EXNOR circuit 6 and NOR circuit 7. Therefore, the signal outputted from the EXNOR circuit 6 has the "H" level (refer to node SB at Tb in FIG. 5) and the signal outputted from the OR circuit 7 has the "L" level (refer to node SB at Tb in FIG. 5). Therefore, the signal outputted from the flip-flop circuits FF61 and FF62 has the "L" level (refer to node A at Tb in FIG. 5).

When the mode switching signal MS is switched to the "L" level from the "H" level, both "H" level signal inverted through the inverter INV13 and "L2 level signal delayed through the delay element 9 are inputted to the input of the OR circuit 7. Accordingly, the OR circuit 7 outputs the "H" level signal (refer to node RB at Tc in FIG. 5). On the other hand, both "H" level signal inverted through the inverter INV13 and the "L" level signal delayed through the delay element 9 are inputted to the input of the EXNOR circuit 6. Therefore, the signal outputted from the EXNOR circuit 6 has the "L" level (refer to node SB at Tc in FIG. 5).

Figure 5:
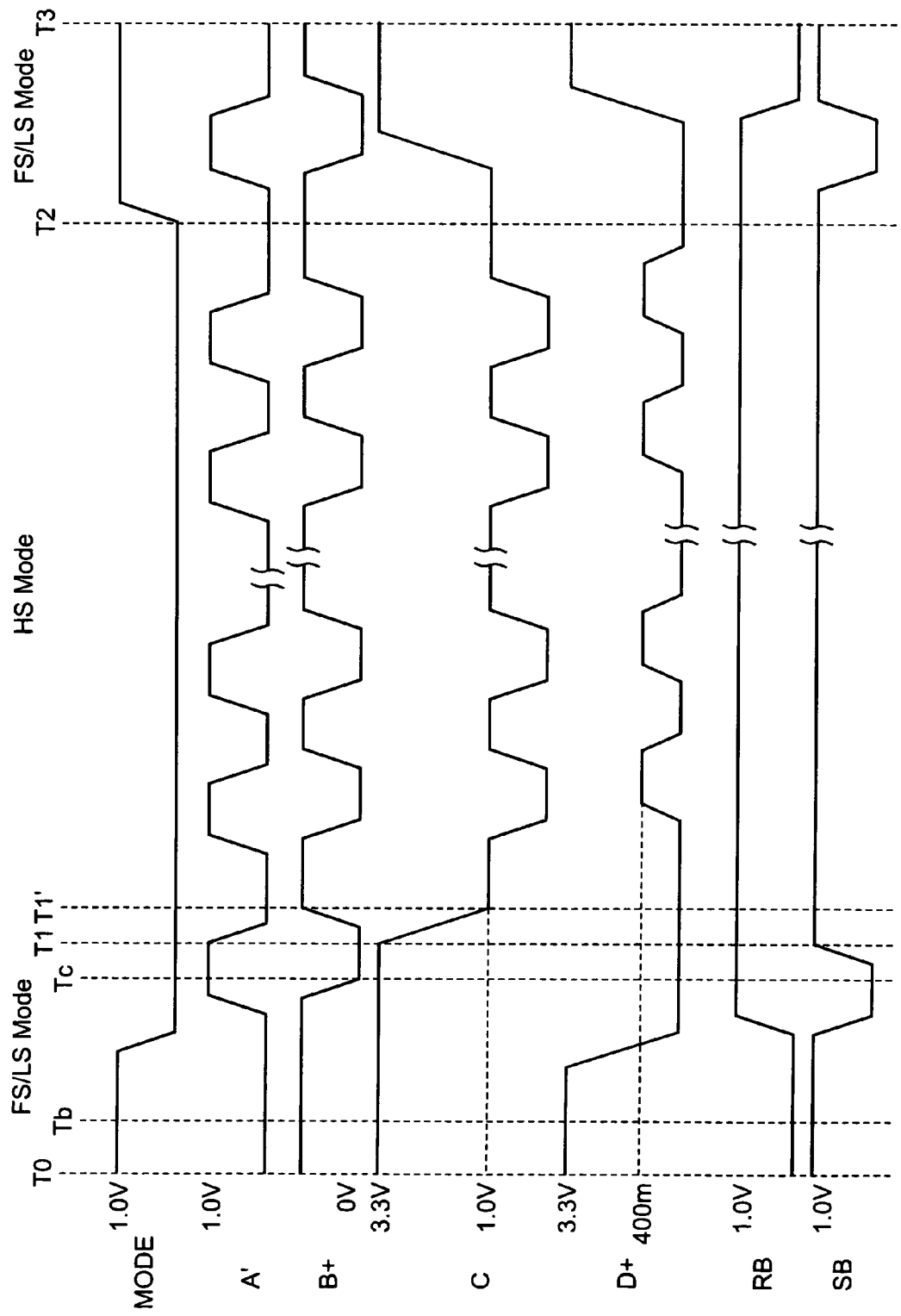
FIG. 5 is a timing chart showing a waveform at each point in the HS output circuit 200 of the second embodiment.

The signals outputted from the flip-flop circuits FF61 and FF62 have the "H" level on the basis of the set signal and the reset signal (refer to node A at Tc in FIG. 5). The inverter INV31 outputs the "L" level signal on the basis of input of the "H" level signal (refer to node B+ at Tc in FIG. 5).

Here, the transfer gates TG1 to TG3 of the shutdown circuit 30 are switched to the on stage from the off stage. In the HS output circuit 200 in this second embodiment, the switch control signal can be outputted after it is delayed for the predetermined time from switching of the mode switching signal MS by the delay adjusting circuit 3 to the "L" level from the "H" level as explained in the first exemplary embodiment. The transfer gates TG1 to TG3 are switched to the on-state from the off-state on the basis of this switch control signal. The "H" level signal is inputted to the gates of the PMOS transistor P31 and the NMOS transistor N31 within the inverter INV31. Therefore, the PMOS transistor P31 enters the off-state, while the NMOS transistor N31 enters the on-state (refer to FIG. 3). Accordingly, the inverter INV31 outputs the "L" level signal. Therefore, charges accumulated in the parasitic capacitance C flow toward the ground potential via the NMOS transistor N31.

As explained above, in the HS output circuit 200 in this second exemplary embodiment, a current path to the ground potential connected to the pre-buffer 20 from the main buffer 40 is formed when the shutdown circuit 30 for controlling the conductive state between the pre-buffer 20 and the main buffer 40 is switched to the on-state from the off-state by controlling the arithmetic operation result outputted from the logic circuit 13 with the set/reset circuit 14. Namely, the "H" level signal is inputted to the pre-buffer 20 in such a timing that the FS/Ls mode is switched to the HS mode. The NMOS transistor connected to the ground potential within the inverter in the pre-buffer 20 turns on based on the "H" level signal. Accordingly, in the HS output circuit 200, charges accumulated in the parasitic capacitance C of the PMOS transistor in the main buffer 40 can flow toward the ground potential.

Figure 6:
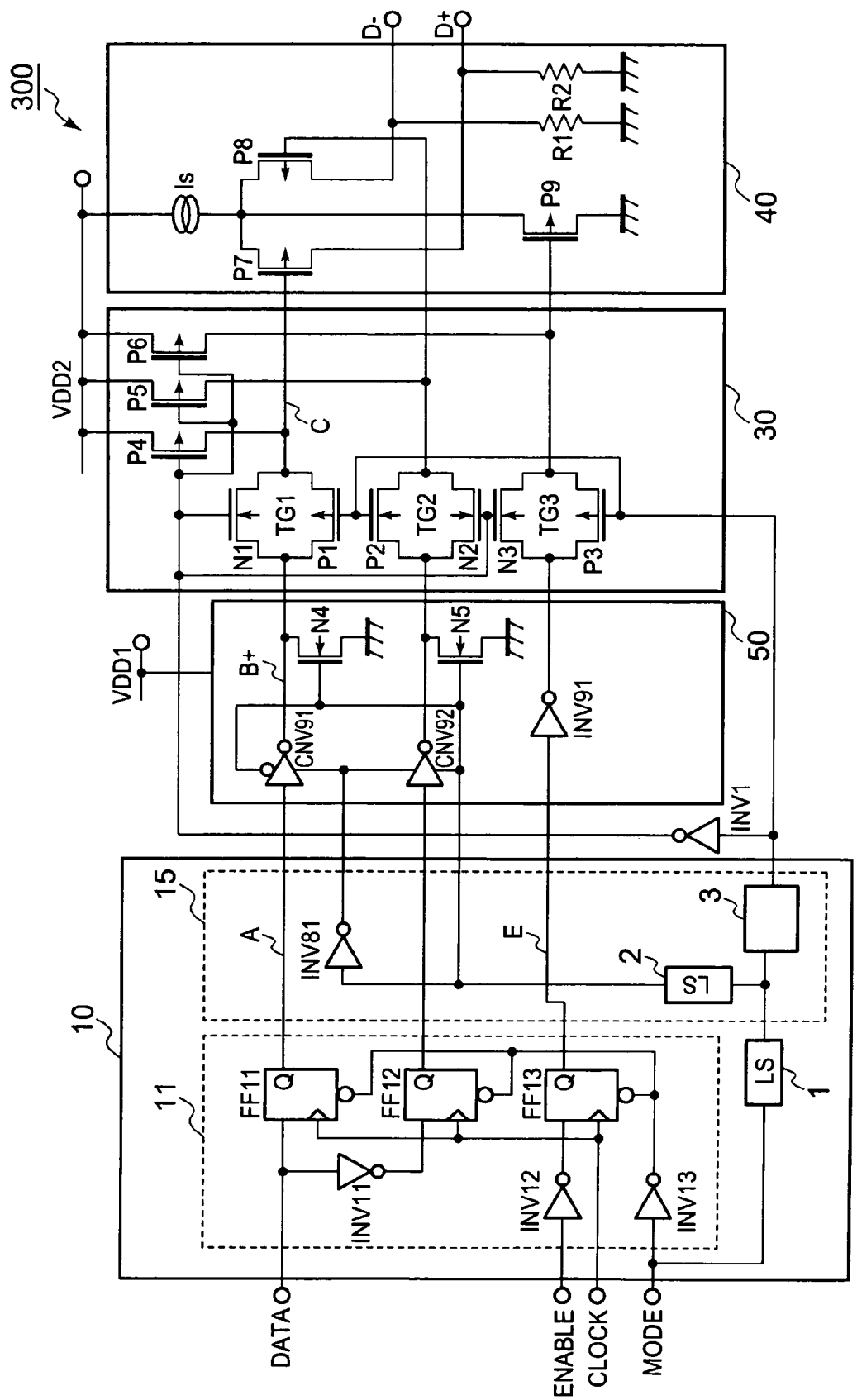
FIG. 6 shows an HS output circuit 300 as a third exemplary embodiment of the present invention.

FIG. 6 shows an HS output circuit a third exemplary embodiment of the present invention. In FIG. 6, elements used in common to FIG. 1 are designated with the like reference numerals and detail explanation thereof will be eliminated here. In the HS output circuit 100 in the first exemplary embodiment, the switch control circuit 12 is provided between the logic circuit 11 and the pre-buffer 20. Meanwhile, in the HS output circuit of this third exemplary embodiment, a pre-buffer control circuit 15 is provided between the pre- buffer 50 different in the internal structure from the pre-buffer 20 of the first exemplary embodiment and the logic circuit 11.

The pre-buffer control circuit 15 includes a level shifter 2, an inverter INV81, and a delay adjusting circuit 3. Connections of the level shifter 2 and delay adjusting circuit 3 will be omitted here, because these elements are connected in the same manner as the switch control circuit 12 in the first embodiment. An input of the inverter INV81 is connected with an output of the level shifter 2.

The pre-buffer 50 includes clocked inverters CNV91, 92, NMOS transistors N4, N5 corresponding to switches, and an inverter INV91. An input of the clocked inverter CNV91 is connected to an output of the flip-flop circuit FF11, while an output thereof is connected to one end of the transfer gate TG1. Moreover, an input of the clocked inverter CNV92 is connected to an output of the flip-flop circuit FF12, while an output thereof is connected to one end of the transfer gate TG2. An inversion control terminal and a normal control terminal of the clocked inverter CNV91 are respectively connected to an inversion control terminal and normal control terminal of the clocked inverter CNV92. In addition, a node between the normal conversion terminal of the clocked inverter CNV91 and the normal control terminal of the clocked inverter CNV92 is connected to an output of the inverter INV81. A source of the NMOS transistor N4 is connected to the ground potential, while a drain thereof is connected to the node between the clocked inverter CNV91 and the transfer gate TG1. A source of the NMOS transistor N5 is connected to the ground potential, while a drain thereof is connected to the node between the clocked inverter CNV92 and the transfer gate TG2. Gates of the NMOS transistor N4 and NMOS transistor N5 are connected to an output of the level shifter 2. Moreover, the pre-buffer 50 is connected to the first power supply voltage VDD1.

Figure 7:
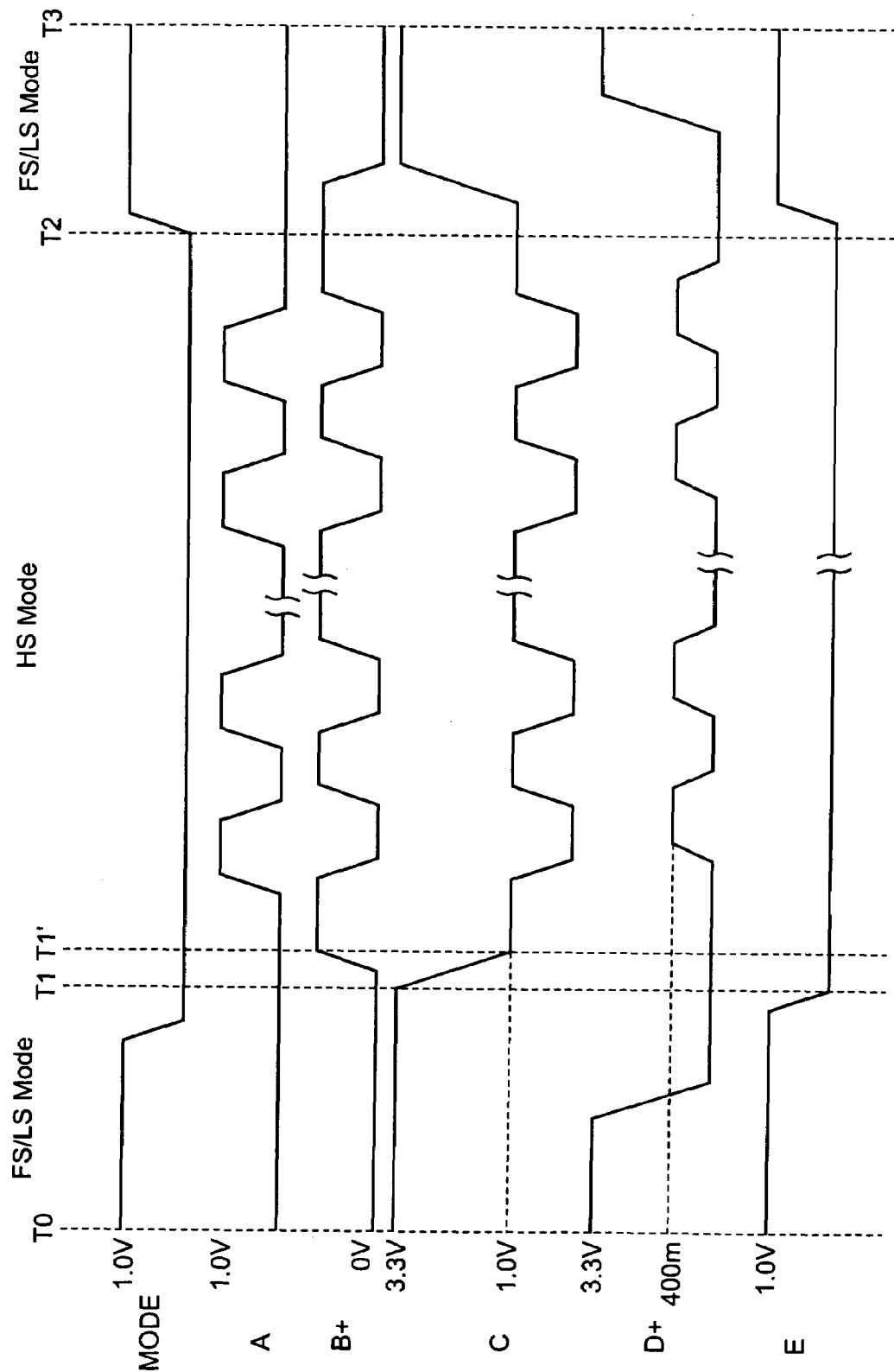
FIG. 7 is a timing chart showing a waveform at each point in the HS output circuit 300 of the third embodiment.

Operations of the HS output circuit 300 of this third exemplary embodiment will be explained with reference to the timing charts of FIG. 6 and FIG. 7. In the first exemplary embodiment, a current path toward the ground potential connected to the pre-buffer 20 from the main buffer 40 is formed when the shutdown circuit 30 for controlling conductive state between the pre-buffer 20 and the main buffer 40 is switched to the on-state from the off-state by inputting the arithmetic operation result to the pre-buffer 20 with the switch control circuit 12. On the other hand, in this third exemplary embodiment, a current path toward the ground potential connected to the pre-buffer 50 from the main buffer 40 is formed when the shutdown circuit 30 for controlling the conductive state between the pre-buffer 50 and the main buffer 40 is switched to the on-state from the off-state by operating the pre-buffer 50 on the basis of the arithmetic operation result generated by the pre-buffer circuit 15. Here, operations of the HS output circuit in this third embodiment is identical to that of the HS output circuit 100 in the first exemplary embodiment, except for operations of the pre-buffer control circuit 15 and pre-buffer 50. Therefore, only operations of the pre-buffer control circuit 15 and pre-buffer 50 when the FS/LS mode is switched to the HS mode will be explained.

In the FS/LS mode, the mode switching signal MS inputted to the mode switching terminal MODE has the "H" level. This mode switching signal MS is inputted to the normal control terminals of the clocked inverters CVN91, CNV92 via the inverter INV81. Moreover, this mode switching signal MS is inputted to the inversion control terminals of the clocked inverters CNV91, CNV92. Therefore, the clocked inverters CVN91, CVN92 are in the high impedance state. In addition, the mode switching signal MS is inputted to the gates of the NMOS transistors N4, N5. Accordingly, the NMOS transistors N4, N5 enter the on-state.

When the FS/LS mode is switched to the HS mode, the mode switching signal MS is switched to the "L" level from the "H" level. Here, the transfer gates TG1, TG2 of the shutdown circuit 30 are also switched to the on-state from the off-state. In the HS output circuit 300 of this third exemplary embodiment, the delay adjusting circuit 3 switches the transfer gates TG1 to TG3 to the on-state from the off-state, as shown in the first embodiment, by delaying the mode switching signal MS for the predetermined period after it is switched to the "L" level from the "H" level. When the shutdown circuit 30 enters the conductive state, charges accumulated in the parasitic capacitance C flow toward the ground potential via the NMOS transistor N31.

As explained above, in the HS output circuit 300 of this third exemplary embodiment, a current path toward the ground potential connected to the pre-buffer 50 from the main buffer 40 is formed when the shutdown cirucit30 for controlling the conductive state between the pre-buffer 50 and the main buffer 40 is switched to the on-state from the off-state by operating the pre-buffer 50 on the basis of the arithmetic operation result generated by the pre-buffer control circuit 15. Namely, in the pre-buffer 50, the clocked inverters CNV91 and CNV92 are in the high impedance state on the basis of the signal outputted from the pre-buffer control circuit 15 and moreover the NMOS transistors N4, N5 are in the on-state when the FS/LS mode is switched to the HS mode. Accordingly, in the HS output circuit 300, charges accumulated in the parasitic capacitance C of the PMOS transistor in the main buffer 40 can flow toward the ground potential.

As explained above, the present invention has the control circuit for inputting the "H" level signal to the pre-buffer when the FS/LS mode is switched to the HS mode. Accordingly, charges accumulated in the parasitic capacitance of the PMOS transistor in the main buffer can flow toward the ground potential when the shutdown circuit for controlling the conductive state between the pre-buffer and the main buffer is switched to the on-state from the off-state.

While the invention has been described in terms of several exemplary embodiments, those skilled in the art will recognize that the invention can be practiced with modification within the spirit and scope of the appended claims.

Further, it is noted that Applicant's intent is to encompass equivalents of all claim elements, even if amended later during prosecution.

What is claimed is:

1. A semiconductor device, comprising:
a pre-buffer which transmits a data signal based on a first power supply voltage;
a main buffer which amplifies and outputs the data signal transmitted by the pre-buffer based on a second power supply voltage different from the first power supply voltage;
a switch unit which controls a conductive state between the pre-buffer and the main buffer based on a switch control signal; and
a control circuit which controls the pre-buffer to set an output level of the pre-buffer to a ground potential in accordance with a transition of a logical level of the switch control signal.

2. The semiconductor device according to claim 1, wherein the control circuit includes a delay adjusting circuit which outputs the switch control signal, to adjust a transition timing of the data signal outputted from the pre-buffer substantially equal to a transition timing when the data signal to be inputted to the main buffer changes from the second power supply voltage to the first power supply voltage, based on a mode switching signal.

3. The semiconductor device according to claim 2, wherein the delay adjusting circuit inputs the mode switching signal and outputs the switch control signal to the switch unit, after the data signal is inputted to the pre-buffer.

4. The semiconductor device according to claim 1, wherein the switch unit fixes an input of the main buffer to the second power supply voltage based on the switch control signal, when the switch unit is in the off-state.

5. The semiconductor device according to claim 1, wherein the control circuit includes a switch control circuit which is responsive to an input data from an outside to output the data signal when a mode switching signal is in a first mode.

6. The semiconductor device according to claim 5, wherein the switch control circuit outputs the data signal based on an inverted AND of the input data and the mode switching signal in the first mode.

7. The semiconductor device according to claim 1, wherein the control circuit includes a set/reset circuit which generates a signal for controlling the data signal inputted to the pre-buffer, in accordance with a mode switching signal and a delayed signal of the mode switching signal.

8. The semiconductor device according to claim 7, wherein the set/reset circuit generates the signal for controlling the data signal based on an exclusive OR, in accordance with the mode switching signal and the delayed signal.

9. The semiconductor device according to claim 1,
wherein the control circuit includes a pre-buffer control circuit which outputs a mode switching signal to the pre-buffer, and
wherein the pre-buffer includes a switch, connected between an input of the switch unit and a ground potential, which is enabled in on-state or off-state in accordance with a mode switching signal.

10. A semiconductor device, comprising:
a pre-buffer which drives an input data with a first power supply voltage, and outputs the input data;
a main buffer which drives the input data outputted from the pre-buffer with a second power supply voltage; and
a control circuit which renders an output of the pre-buffer to be grounded when a mode signal indicating non-selection of the pre-buffer and the main buffer is inputted.

11. A semiconductor circuit, comprising:
a buffer including a first transistor of a first conductive type and a second transistor of a second conductive type coupled in series between a first power source terminal and a second power source terminal, a first power source voltage potential on said first power source terminal being higher than a second power source voltage potential on said second power source terminal;
a third transistor coupled between a third power source terminal and an output terminal, said third transistor including a control gate coupled to a first node, a third power source voltage potential being higher than said first power source voltage potential;
a transfer gate coupled between a connecting point of said first and second transistors and said first node;
a fourth transistor coupled between said first node and said third power source terminal, said fourth transistor being active when said transfer gate is inactive to charge said third power source voltage potential to said first node, said fourth transistor being inactive when said transfer gate is active; and a control circuit which discharges said third power source potential on said first node to said second power source terminal via said transfer gate when said transfer gate changes from being the inactive into being active.

12. The semiconductor circuit as claimed in claim 11, wherein said buffer comprises a first buffer, said transfer gate comprises a first transfer gate and said output terminal comprises a first output terminal, said semiconductor circuit further comprising:
  a second buffer including a fifth transistor of said first conductive type and a sixth transistor of said second conductive type coupled in series between said first power source terminal and said second power source terminal, said second buffer receiving a data signal having a first potential and said first buffer receiving said data signal having a second potential opposite to said first potential;
  a seventh transistor coupled between said third power source terminal and a second output terminal, said seventh transistor including a control gate coupled to a second node;
  a second transfer gate coupled between a connecting point of said fifth and sixth transistors and said second node; and
  an eighth transistor coupled between said second node and said third power source terminal, said eighth transistor being active when said second transfer gate is inactive to charge said third power source voltage potential to said second node, said eighth transistor being inactive when said second transfer gate is active,
wherein said control circuit discharges said third power source potential on second node to said second power source terminal via said second transfer gate when said second transfer gate changes from being the non-activated into being the activated.

13. The semiconductor circuit as claimed in claim 11, wherein said control circuit comprises:
  a logic gate which outputs a signal rendering said second transistor to be turned on to discharge said third power source potential on said first node to said second power source terminal via said second transistor.

14. The semiconductor circuit as claimed in claim 13, further comprising:
  a flip flop circuit which is reset in response to a mode signal,
  wherein said logic gate outputs said signal in response to said mode signal.

15. The semiconductor circuit as claimed in claim 14, wherein said fourth transistor and said transfer gate are controlled in response to said mode signal.

16. The semiconductor circuit as claimed in claim 11, further comprising:
  a first logic gate which outputs a set/reset signal in response to a mode signal; and
  a flip flop circuit which is reset in response to said set/reset signal.

17. The semiconductor circuit as claimed in claim 11, further comprising:
  a discharge transistor to discharge said third power source voltage potential on said first node to said second power source terminal via said discharge transistor in response to a mode signal,
  wherein said first buffer comprises a tri-state buffer which makes a high impedance state at its output in response to said mode signal.

* * * * *